(12) United States Patent
Wang et al.

(10) Patent No.: US 7,541,267 B1
(45) Date of Patent: Jun. 2, 2009

(54) REVERSED T-SHAPED FINFET

(75) Inventors: Haihong Wang, Milpitas, CA (US);
Shibly S. Ahmed, San Jose, CA (US);
Ming-Ren Lin, Cupertino, CA (US);
Bin Yu, Cupertino, CA (US)

(73) Assignee: Advanced Micro Devices, Inc.,
Sunnyvale, CA (US)

( * ) Notice: Subject to any disclaimer, the term of this patent is extended or adjusted under 35 U.S.C. 154(b) by 0 days.

(21) Appl. No.: 11/765,611

(22) Filed: Jun. 20, 2007

Related U.S. Application Data

(62) Division of application No. 10/761,374, filed on Jan. 22, 2004, now Pat. No. 7,250,645.

(51) Int. Cl.
*H01L 21/28* (2006.01)

(52) U.S. Cl. .................. 438/574; 438/576; 438/579; 438/157; 257/E21.233

(58) Field of Classification Search ................. 438/156, 438/157, 173, 176, 206, 212, 574, 576, 578, 438/579
See application file for complete search history.

(56) References Cited

U.S. PATENT DOCUMENTS 5,241,203 A * 8/1993 Hsu et al. ................ 257/344
6,069,032 A * 5/2000 Lee ......................... 438/197
6,475,890 B1 11/2002 Yu
6,787,854 B1 9/2004 Yang et al.
6,894,337 B1 5/2005 Wang et al.
2004/0113171 A1 6/2004 Chiu et al.

OTHER PUBLICATIONS

Digh Hisamoto et al., "FinFET-A Self-Aligned Double-Gate MOSFET Scalable to 20 nm," IEEE Transactions on Electron Devices, vol. 47, No. 12, Dec. 2000, pp. 2320-2325.
Yang-Ku Choi et al., "Sub-20 nm CMOS FInFET Technologies," 2001 IEEE, IEDM, pp. 421-424.
Xuejue Huang et al., "Sub-50 nm P-Channel FinFET," IEEE Transactions on Electron Devices, vol. 48, No. 5, May 2001, pp. 880-886.
Xuejue Huang et al., "Sub 50-nm FinFet: PMOS," 1999 IEEE, IEDM, pp. 67-70.
Yang-Kyu Choi et al., "Nanoscale CMOS Spacer FinFET for the Terabit Era," IEEE Electron Device Letters, vol. 23, No. 1, Jan. 2002, pp. 25-27.

* cited by examiner

*Primary Examiner*—Alexander G Ghyka
*Assistant Examiner*—Reema Patel
(74) *Attorney, Agent, or Firm*—Harrity & Harrity, LLP

(57) ABSTRACT

A method includes forming a first rectangular mesa from a layer of semiconducting material and forming a first dielectric layer around the first mesa. The method further includes forming a first rectangular mask over a first portion of the first mesa leaving an exposed second portion of the first mesa and etching the exposed second portion of the first mesa to produce a reversed T-shaped fin from the first mesa.

8 Claims, 12 Drawing Sheets

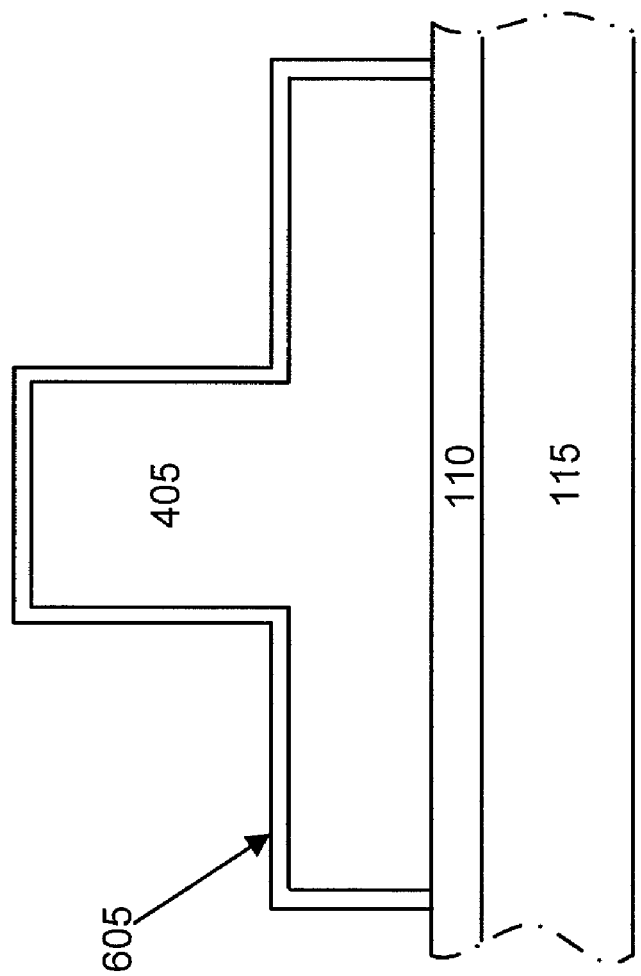

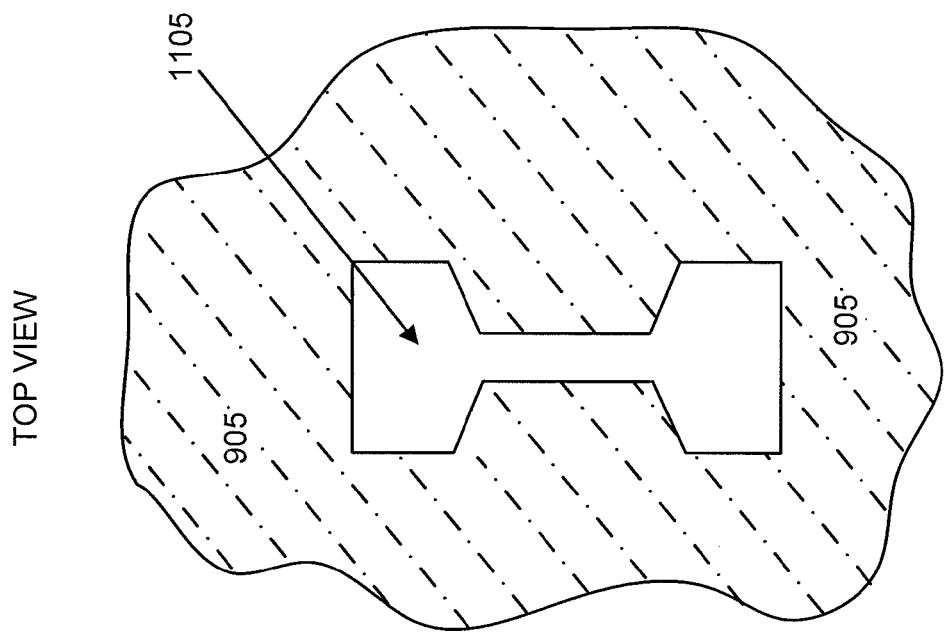
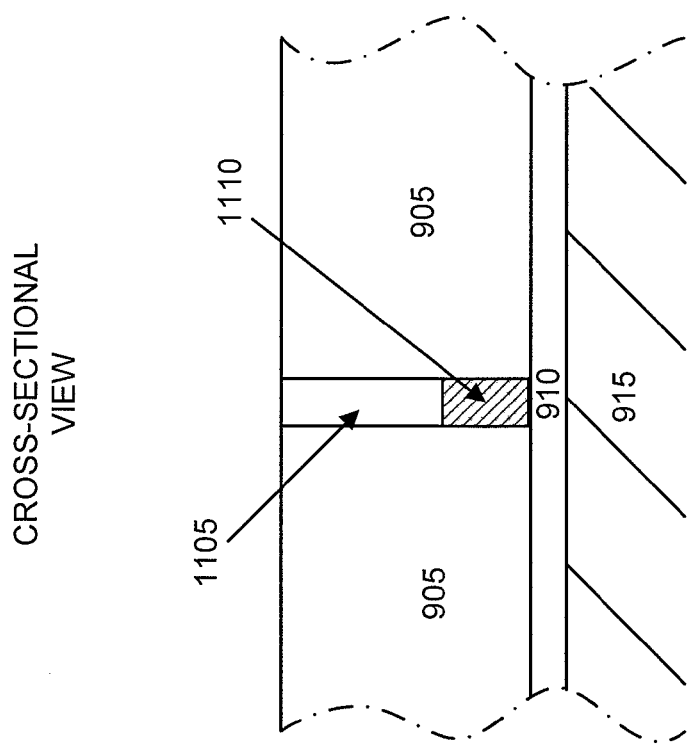

US 7,541,267 B1

REVERSED T-SHAPED FINFET

RELATED APPLICATION

The instant application is a divisional of U.S. application Ser. No. 10/761,374, filed Jan. 22, 2004, the disclosure of which is incorporated by reference herein.

TECHNICAL FIELD

The present invention relates generally to transistors and, more particularly, to fin field effect transistors (FinFETs).

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are, therefore, being explored to improve FET performance and allow further device scaling.

Double-gate MOSFETs represent structures that have been considered as candidates for succeeding existing planar MOSFETs. In double-gate MOSFETs, two gates may be used to control short channel effects. A FinFET is a recent double-gate structure that exhibits good short channel behavior. A FinFET includes a channel formed in a vertical fin. The FinFET structure may be fabricated using layout and process techniques similar to those used for conventional planar MOSFETs.

DISCLOSURE OF THE INVENTION

Implementations consistent with the present invention provide a reversed T-shaped FinFET. The exemplary FinFET includes a fin formed in a reversed T-shape and a dielectric layer formed over surfaces of the fin to conform with the shape of the fin. A gate is further formed over the dielectric layer to conform with the shape of the fin. A FinFET having a reversed T-shape, consistent with the invention, achieves better current drivability and short channel control than other conventional shaped FinFETs.

Additional advantages and other features of the invention will be set forth in part in the description which follows and, in part, will become apparent to those having ordinary skill in the art upon examination of the following, or may be learned from the practice of the invention. The advantages and features of the invention may be realized and obtained as particularly pointed out in the appended claims.

According to the present invention, the foregoing and other advantages are achieved in part by a method that includes forming a first rectangular mesa from a layer of semiconducting material and forming a first dielectric layer around the first mesa. The method further includes forming a first rectangular mask over a first portion of the first mesa leaving an exposed second portion of the first mesa and etching the exposed second portion of the first mesa to produce a reversed T-shaped fin from the first mesa.

According to another aspect of the invention, a method of forming a fin field effect transistor (FinFET) includes forming a reversed T-shaped fin, where forming the reversed T-shaped fin comprises: etching a first rectangular mesa using a rectangular mask having dimensions ranging from about 100 Å to about 1000 Å in width and from about 100 Å to about 1000 Å in length to produce the reversed T-shaped fin. The method further includes forming source and drain regions adjacent the reversed T-shaped fin, forming a first dielectric layer adjacent surfaces of the fin and forming a gate adjacent the first dielectric layer.

According to a further aspect of the invention, a method includes forming a first rectangular mesa from a layer of semiconducting material, forming a first dielectric layer around the first mesa such that an upper surface of the first dielectric layer is substantially co-planar with an upper surface of the first mesa, and forming a rectangular mask over a first portion of the first mesa leaving an exposed second portion of the first mesa. The method further includes etching the exposed second portion of the mesa to a depth ranging from about 100 Å to about 1000 Å below an upper surface of the first mesa to produce a reversed T-shaped fin from the first mesa, forming a second dielectric layer over surfaces of the reversed T-shaped fin, and forming a second rectangular mesa over the reversed T-shaped fin. The method further includes forming a second rectangular mask over a first portion of the second mesa leaving an exposed second portion of the second mesa, etching the exposed second portion of the second mesa to produce a gate that conforms to a shape of the reversed T-shaped fin and forming source and drain regions adjacent different ends of the reversed T-shaped fin.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIG. 6 illustrates a cross-sectional view of a dielectric layer formed adjacent the T-shaped fin of FIGS. 5A and 5B consistent with the invention;

FIGS. 12A and 12B illustrate the formation of a stresser layer and a strained channel layer in the trench of FIG. 11 consistent with another embodiment of the invention;

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Consistent with the present invention, an exemplary reversed T-shaped FinFET is provided that achieves better current drivability and short channel control than conventional shaped FinFETs.

Figure 1:
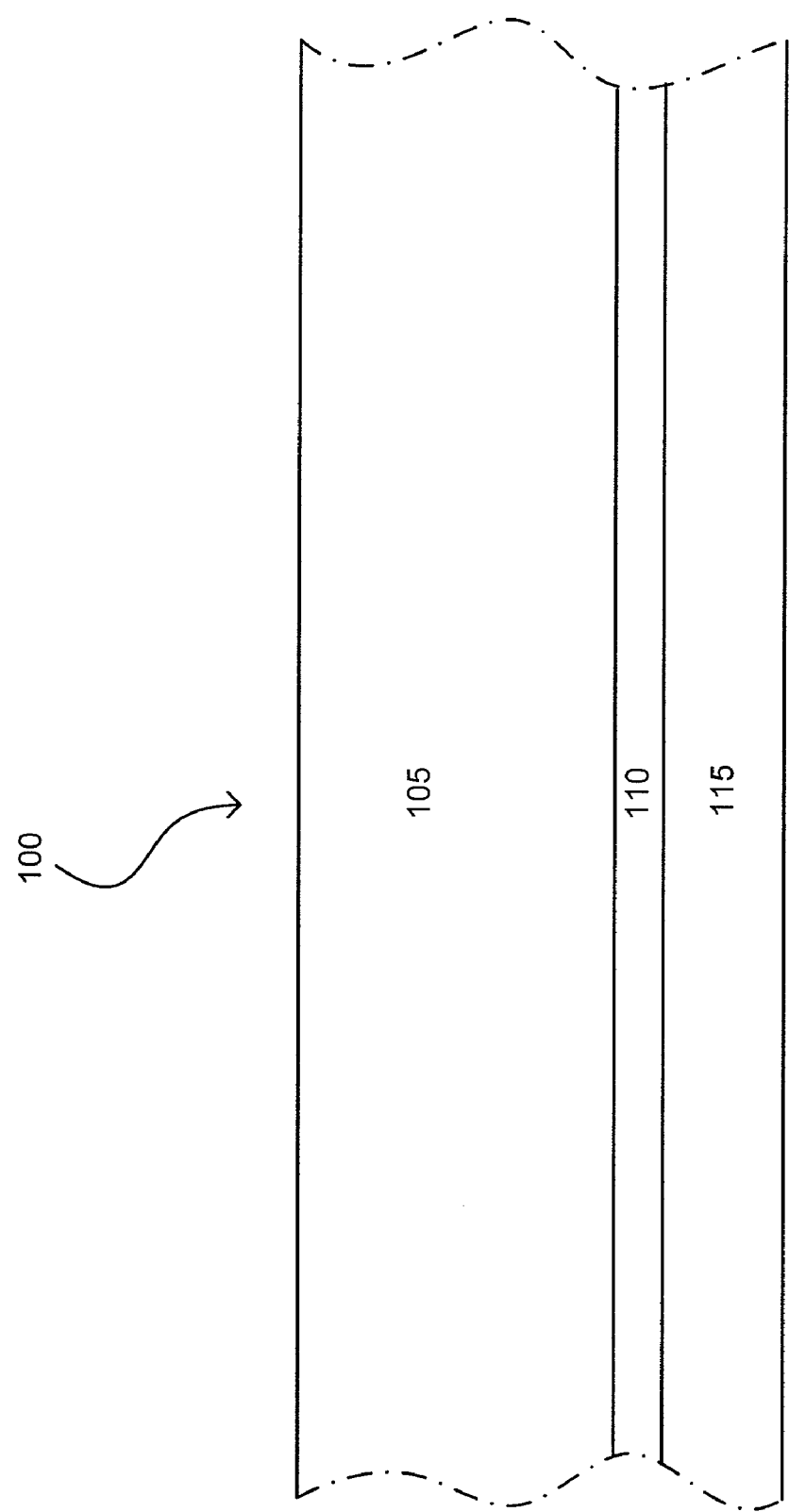
FIG. 1 illustrates exemplary layers of a silicon-on-insulator (SOI) wafer that may be used for forming a fin of a FinFET consistent with the present invention.

FIG. 1 illustrates a cross-section of a silicon on insulator (SOI) wafer 100 formed in accordance with an exemplary embodiment of the present invention. SOI wafer 100, consistent with the present invention, may include a buried oxide layer 110 formed on a substrate 115. A fin layer 105 may further be formed on buried oxide layer 110. The thickness of fin layer 105 may range, for example, from about 200 Å to about 1500 Å and the thickness of buried oxide layer 110 may range, for example, from about 1000 Å to about 3000 Å. Fin layer 105 and substrate 115 may include, for example, silicon, though other semiconducting materials, such as germanium, may be used.

Figure 2B:
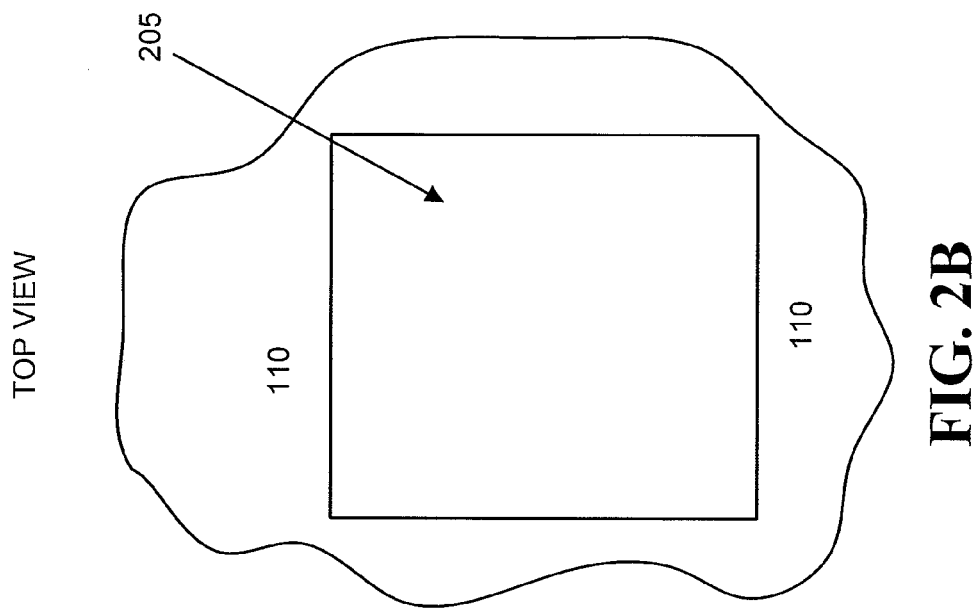
FIGS. 2A and 2B illustrate the formation of a mesa from the fin layer of FIG. 1 consistent with the invention.
Figure 2A:
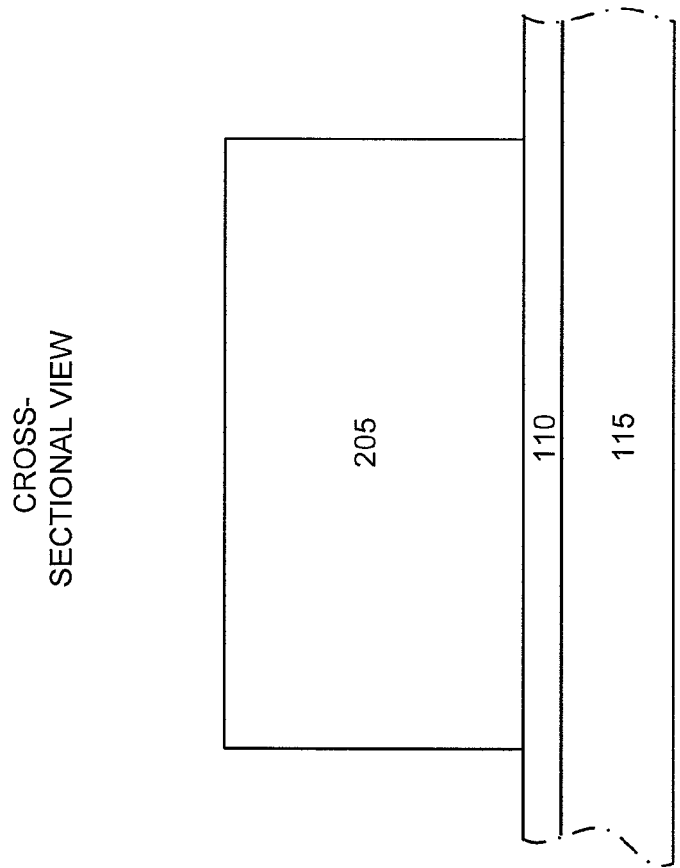

As shown in FIGS. 2A and 2B, a mesa 205 may be formed from fin layer 105. Mesa 205 may be formed, for example, using a rectangular active mask and conventional etching processes. For example, a conventional photoresist material may be patterned and etched to define a rectangular mask having dimensions ranging from about 100 Å to about 1000 Å in length and about 100 Å to about 1000 Å in width. The areas not covered by the mask may then be etched, with the etching terminating on buried oxide layer 110. The photoresist material may then be removed.

Figure 3B:
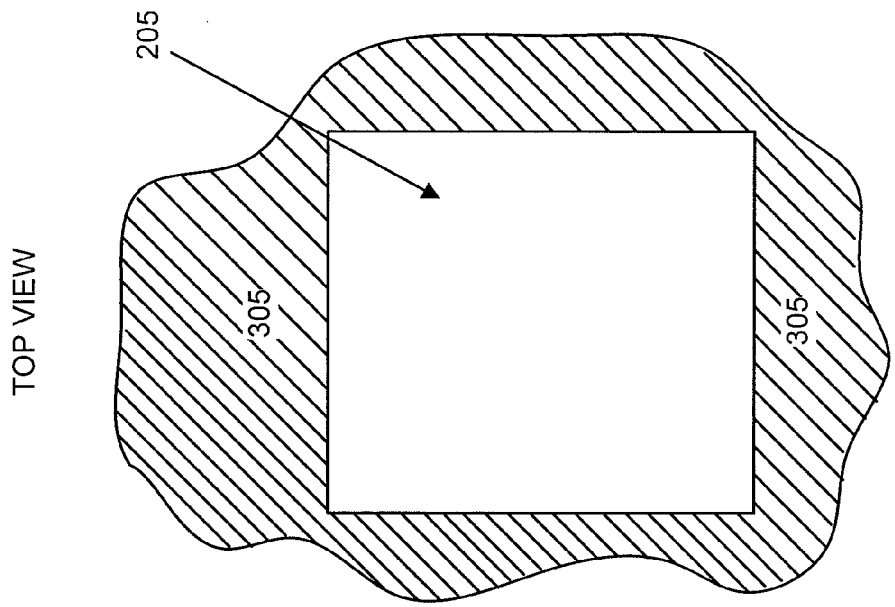
FIGS. 3A and 3B illustrate the formation of a TEOS layer adjacent the mesa of FIGS. 2A and 2B consistent with the invention.
Figure 3A:
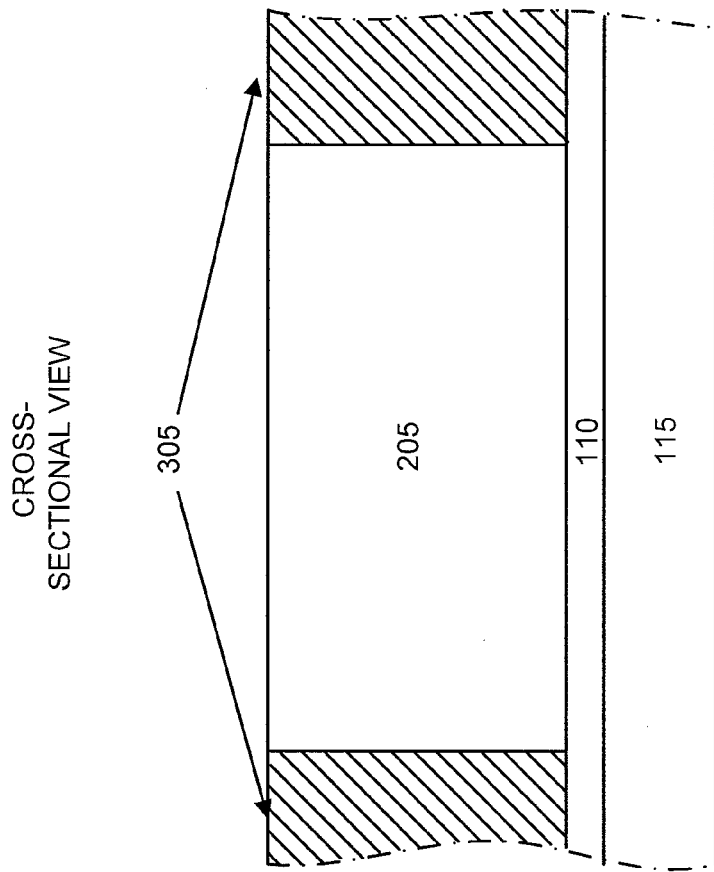

As shown in FIGS. 3A and 3B, a layer 305 of tetraethylorthosilicate (TEOS), or any other dielectric material, may then be formed around mesa 205. Layer 305 may then be polished back to make the upper surface of layer 305 coplanar with the upper surface of mesa 205 using, for example, a conventional chemical-mechanical polishing (CMP) process, as shown in FIG. 3A. The thickness of layer 305 may range, for example, from about 200 Å to about 2000 Å.

Figure 4B:
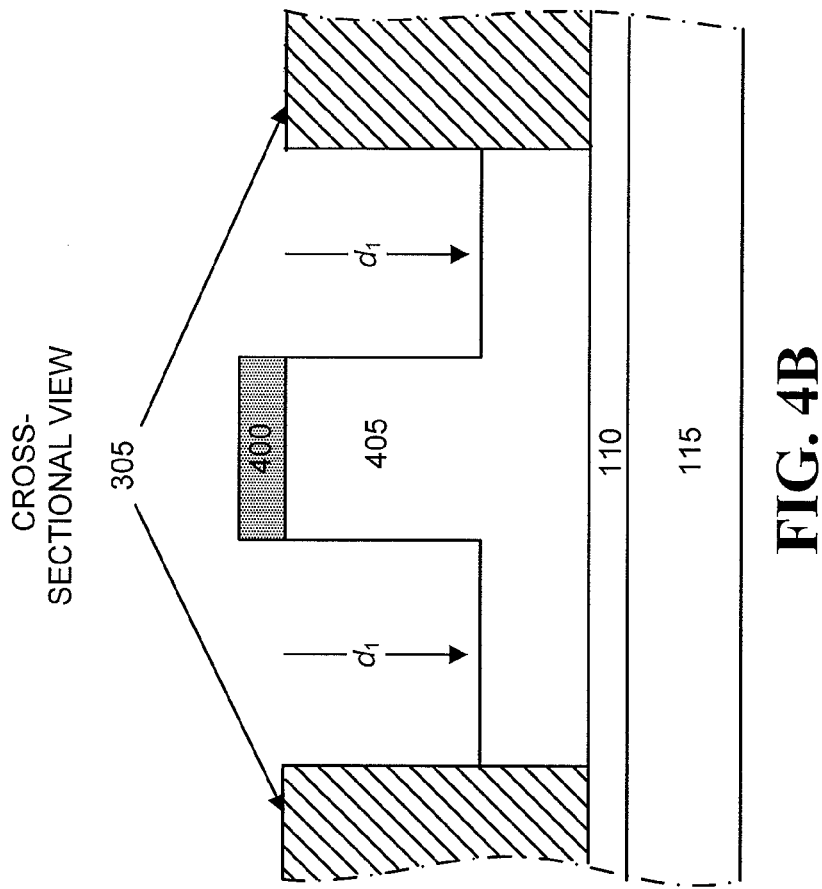
FIGS. 4A and 4B illustrate the formation of a T-shaped fin from the mesa of FIGS. 3A and 3B consistent with the invention.
Figure 4A:
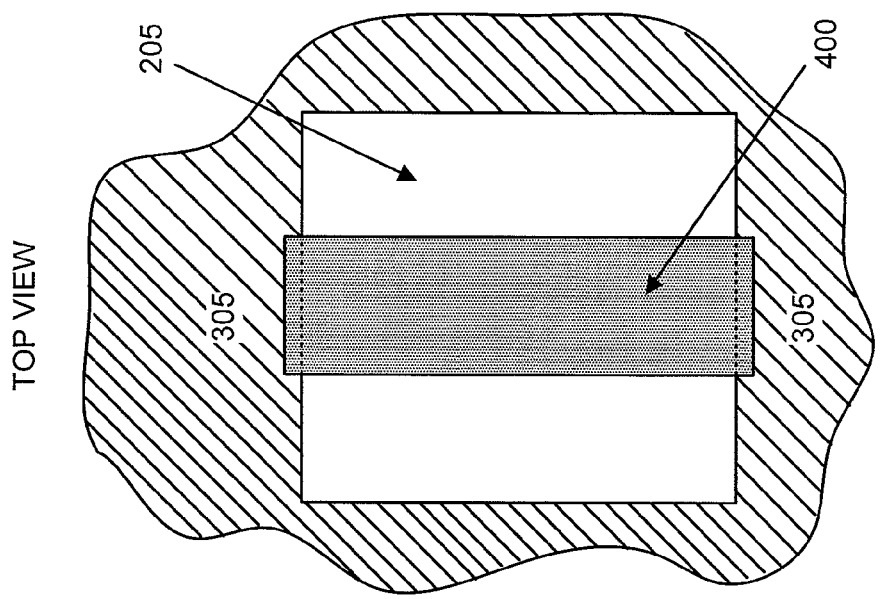

As further shown in FIGS. 4A and 4B, an active mask 400 may be formed over mesa 205. Mask 400 may be formed using a conventional photoresist material and its length may extend about 100 nm beyond mesa 205 on each end, and its width may range from about 100 Å to about 1000 Å after photoresist trimming. Mask 400 may be used to etch away exposed portions of mesa 205 to a depth $d_1$ on either side of mask 400, where depth $d_1$ may range from about 100 Å to about 1000 Å below the upper surface of mesa 205. In one implementation, the depth $d_1$ may be about 1000 Å. Etching the exposed portions of mesa 205 produces a reversed T-shaped fin 405, as shown in FIG. 4B. Subsequent to etching, mask 400 may be removed.

Figure 5B:
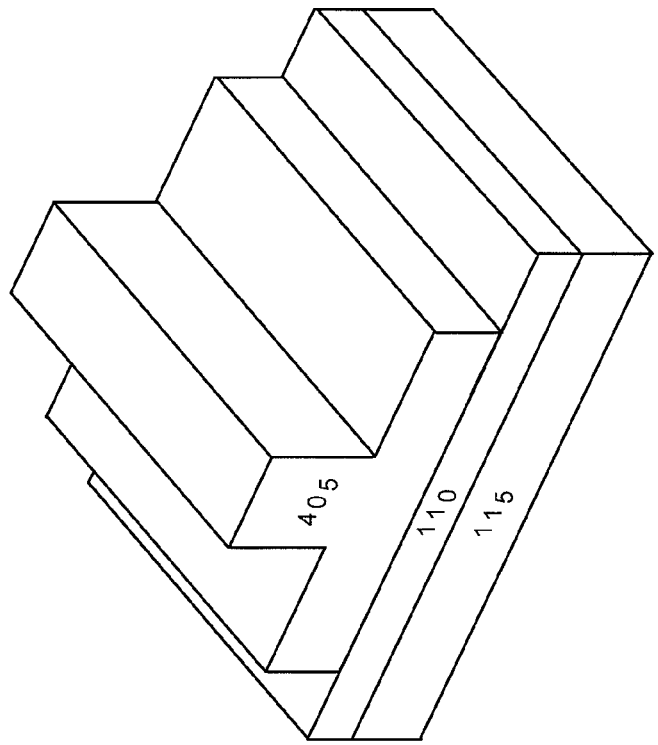
FIGS. 5A and 5B illustrate the removal of the TEOS layer of FIGS. 4A and 4B consistent with the invention.
Figure 5A:
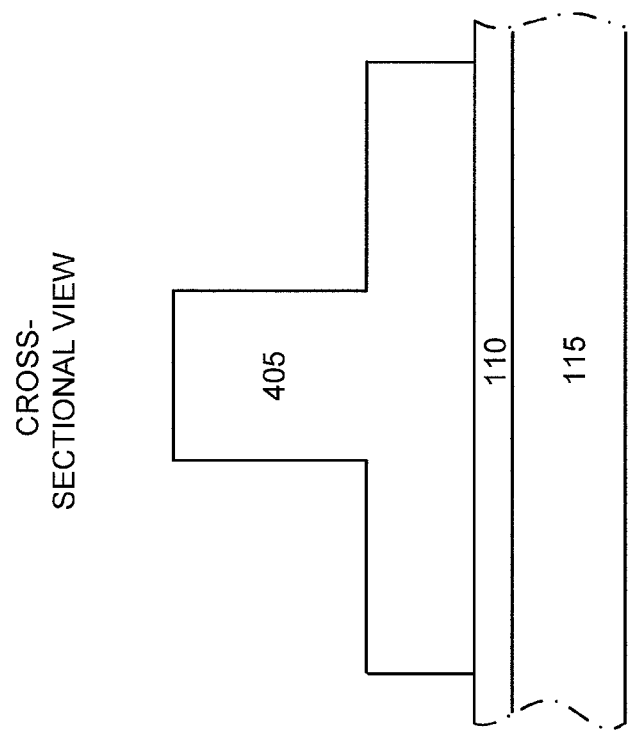
Figure 8:
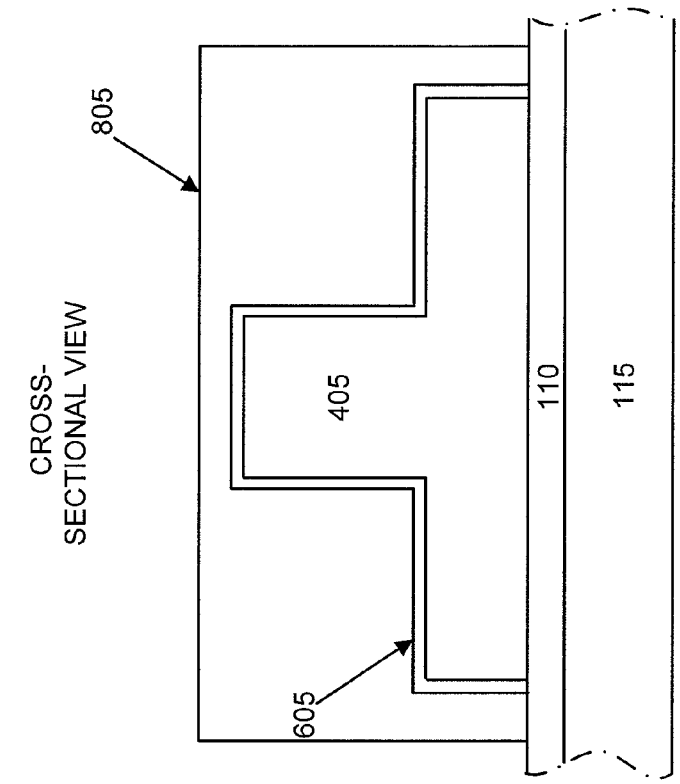
FIG. 8 illustrates the formation of another mesa from the gate layer of FIG. 7 consistent with the present invention.

TEOS layer 305 may then be removed from around fin 405, as shown in FIGS. 5A and 5B, leaving reversed T-shaped fin 405. As further shown in FIG. 6, a layer 605 of gate insulation may then be formed over fin 405. Gate insulation layer 605 may be thermally grown or deposited using conventional deposition processes. Gate insulation layer 605 may include SiO, $SiO_2$, SiN, SiON, $HFO_2$, $ZrO_2$, $Al_2O_3$, HfSiO(x) ZnS, $MgF_2$, or other high-K dielectric materials. The thickness of layer 605 may range, for example, from about 10 Å to about 50 Å.

Figure 7:
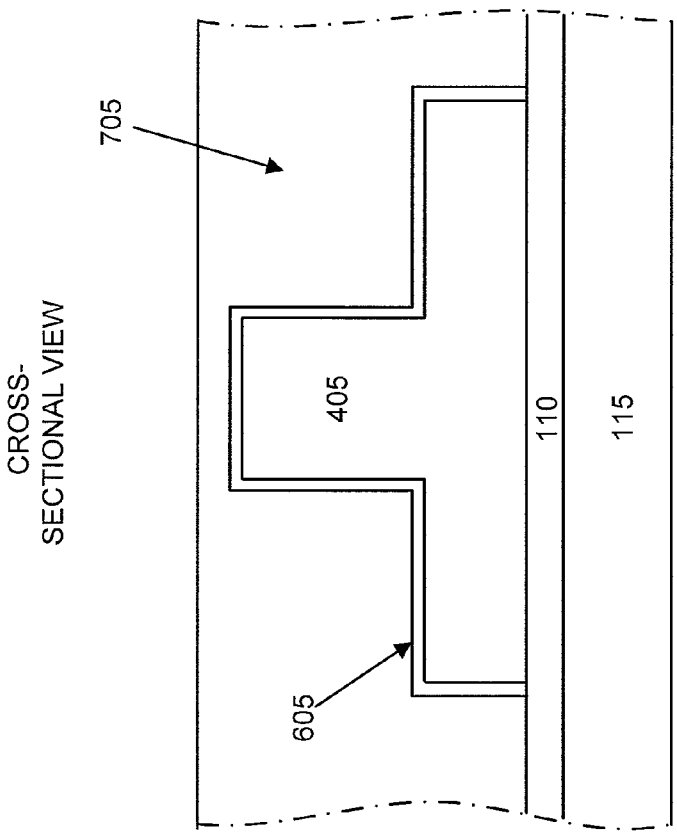
FIG. 7 illustrates the formation of a gate layer over the T-shaped fin of FIG. 6 consistent with the invention.

A layer of gate material 705 may then be formed over reversed T-shaped fin 405, as shown in FIG. 7. Gate material 705 may include, for example, polysilicon or a metal material, such as, for example, TiN, though other materials may be used. The thickness of layer 705 may range, for example, from about 200 Å to about 1000 Å.

Another mesa 805, comprising the gate material 705, may be formed, for example, using a rectangular active mask and conventional etching processes. For example, a conventional photoresist material may be patterned and etched to define a rectangular mask (not shown) having dimensions ranging from about 100 Å to about 1000 Å in length and about 100 Å to about 1000 Å in width. The areas not covered by the mask may then be etched, with the etching terminating on buried oxide layer 110. The photoresist material may then be removed.

Figure 9B:
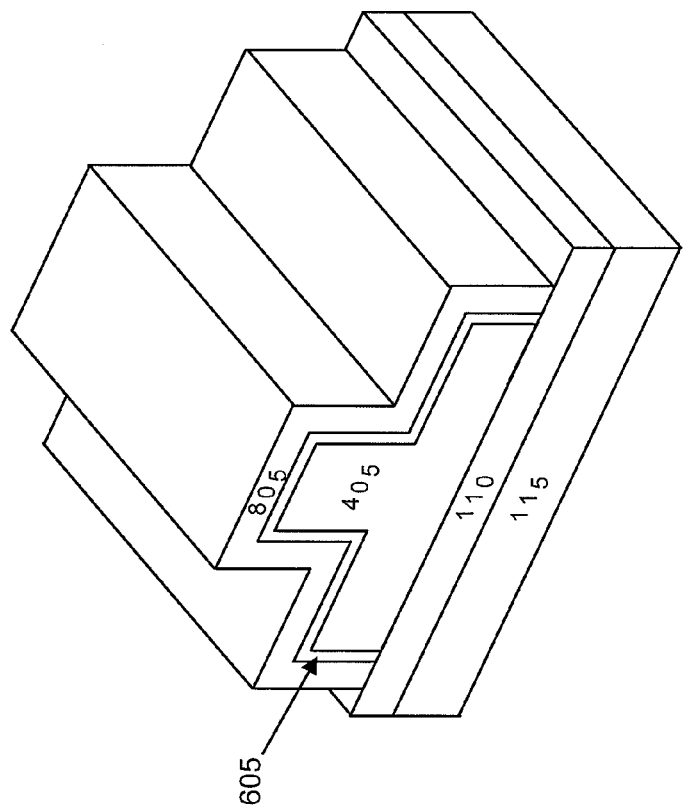
FIGS. 9A and 9B illustrate the formation of a gate from the mesa of FIG. 8 consistent with the present invention.
Figure 9A:
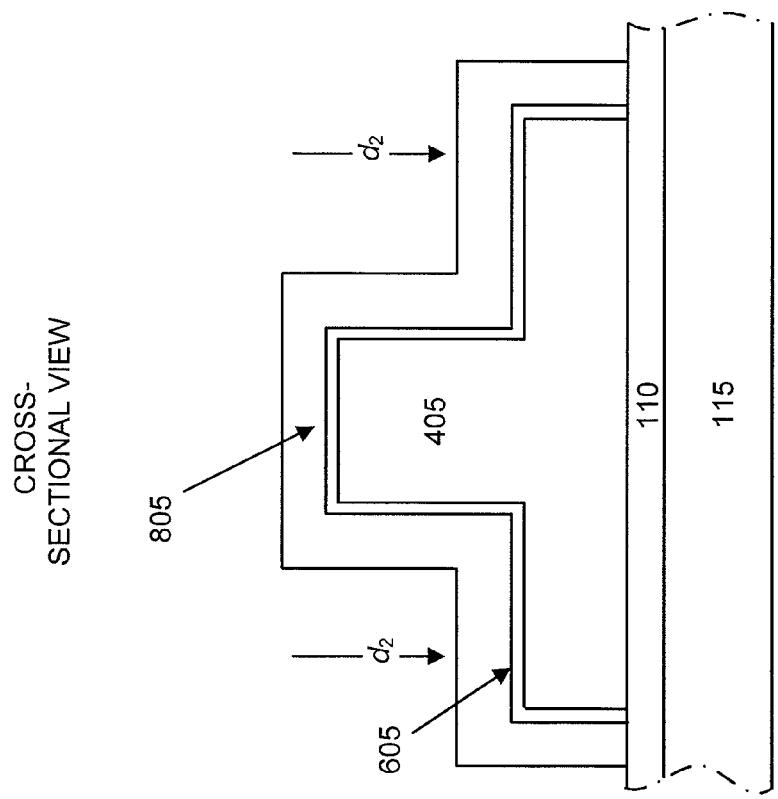

As further shown in FIGS. 9A and 9B, another active mask (not shown) may be formed over mesa 805. The mask may be formed using a conventional photoresist material and its length may extend about 100 nm beyond mesa 805 on each end, and its width may range from about 100 Å to about 1000 Å after photoresist trimming. The mask may be used to etch away exposed portions of mesa 805 to a depth $d_2$ on either side of the mask, where depth $d_2$ may range from about 100 Å to about 1000 Å below the upper surface of mesa 805. In one implementation, the depth $d_2$ may be about 1000 Å. Etching the exposed portions of mesa 805 conforms gate material 705 to the reversed T-shape of fin 405, as shown in FIG. 9B. Subsequent to etching, the mask may be removed.

Source and drain regions (not shown) may be formed adjacent respective ends of fin 405. The source and drain regions may be formed by, for example, deposition of a layer of semi-conducting material over fin 405. The source 2 and drain regions may be formed from the layer of semi-conducting material using, for example, conventional photolithographic and etching processes. One skilled in the art will recognize, however, that other existing techniques may be used for forming the source and drain regions. For example, the source and drain regions may be formed by patterning and etching fin 405. The source and drain regions may include a material such as, for example, silicon, germanium, or silicon-germanium (Si—Ge).

The reverse T-shaped FinFET, formed in accordance with the exemplary process described above, achieves optimized current drivability and short channel control, particularly as compared to more conventionally shaped FinFETs.

Exemplary Silicon-Germanium Fin Stresser Removal for U-Gate/Round Gate FinFET

Figure 10:
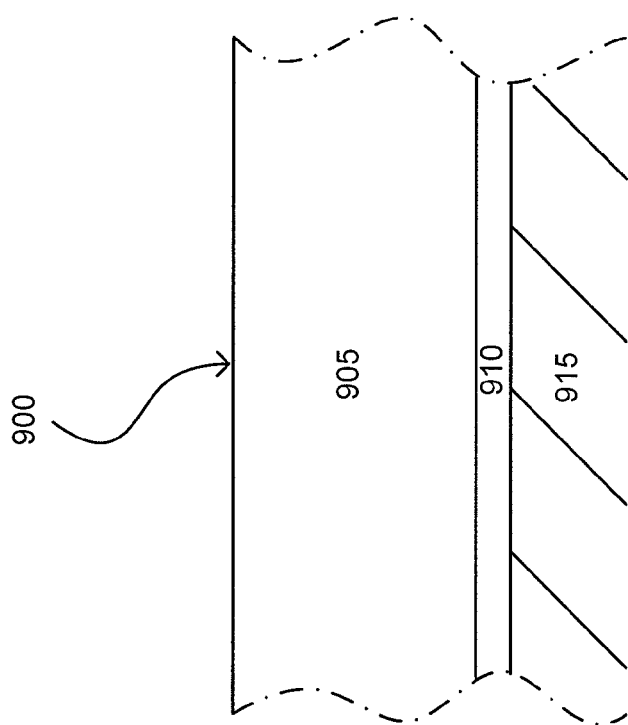
FIG. 10 illustrates a starting buried oxide layer, seed layer, and oxide layer consistent with another embodiment of the invention.

FIGS. 10-15 illustrate an exemplary process for forming a strained fin for a U-gate/round gate FinFET using a silicon-germanium fin stresser consistent with another embodiment of the invention. As shown in FIG. 10, the exemplary process may begin with the formation of a seed layer 910 and an oxide layer 905 on a buried oxide (BOX) layer 915. Seed layer 910 may include, for example, germanium (Ge), though other semiconducting materials may be used, and may be formed using, for example, conventional deposition processes. Seed layer 910 may range, for example, from about 200 Å to about 1000 Å in thickness. Oxide layer 905 may include, for example, SiO or $SiO_2$, though other oxide materials may be used, and may be formed, for example, from a conventional CVD process. Oxide layer 905 may range, for example, from about 800 Å to about 1200 Å in thickness.

Figure 11:
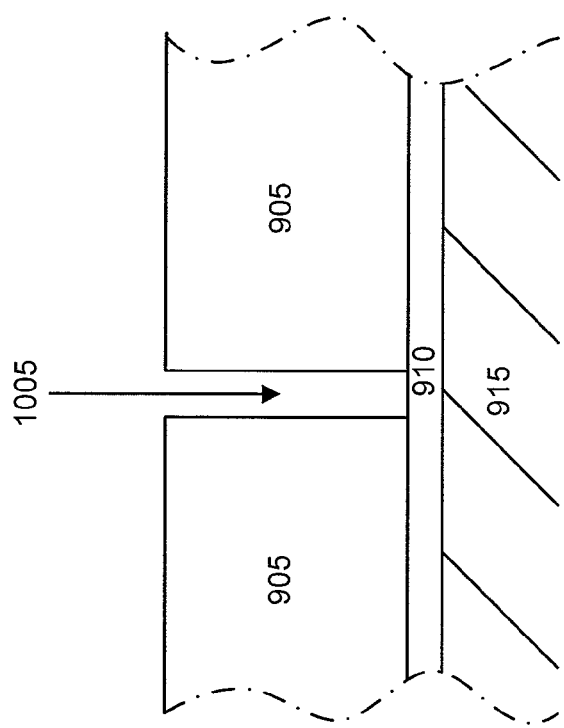
FIG. 11 illustrates formation of a trench within the oxide layer of FIG. 10 consistent with another embodiment of the invention.

As shown in FIG. 11, a trench 1005 may be formed in oxide layer 905 using, for example, conventional photolithographic and etching processes. Trench 1105 may range, for example, from about 500 Å to about 5000 Å in width. As further shown in FIGS. 12A and 12B, a stresser layer 1110 may be formed within trench 1005. Stresser layer 1110 may be formed, for example, using selective epitaxy and may range from about 100 Å to about 1000 Å in thickness. A strained channel 1105 may then be formed over stresser layer 1110. Strained channel layer 1105 may be formed, for example, using selective epitaxy and may range from about 100 Å to about 1000 Å in thickness. After formation of layer 1105, excess material of layer 1105 may be polished off using, for example, a conventional CMP process.

Stresser layer 1110 may include a crystalline material with a lattice constant larger than the lattice constant of a crystalline material selected for strained channel layer 1105. If, for example, silicon is selected for the strained channel layer, stresser layer 1110 may include a crystalline material with a lattice constant larger than the lattice constant of silicon. Stresser layer 1110 may include, for example, $Si_xGe_{(1-x)}$ with x approximately equal to 0.7. Other values of x may be appropriately selected. One skilled in the art will recognize that crystalline materials other than $Si_xGe_{(1-x)}$ may be used such that the material's lattice constant is larger than the lattice constant of the crystalline material selected for the strained channel layer. Since strained channel layer 1105 may include a crystalline material that is lattice constant mismatched with the crystalline material of stresser layer 1110, tensile strain is induced within strained channel layer 1105, which increases carrier mobility. Increasing the carrier mobility, in turn, increases the drive current of the resulting FinFET transistor, thus, improving FinFET performance.

Figure 14:
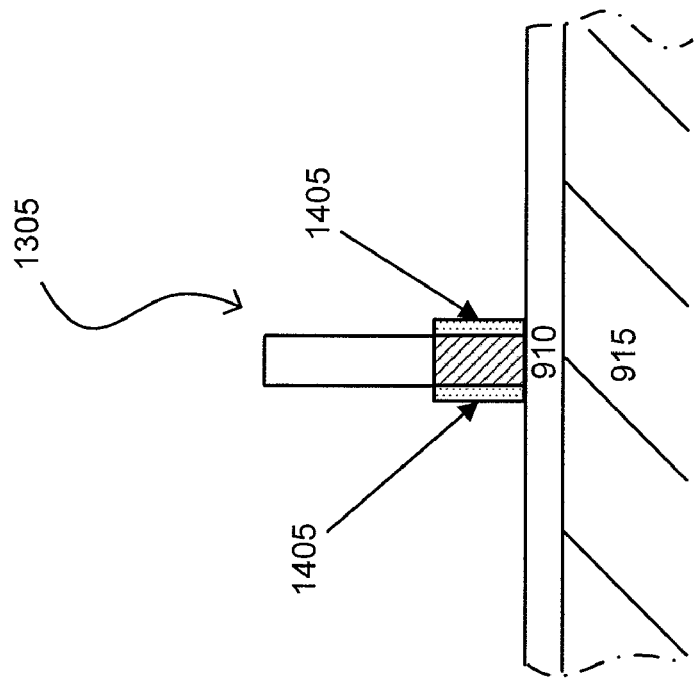
FIG. 14 illustrates the oxidization of the stresser layer of FIG. 13 consistent with another embodiment of the invention.
Figure 13:
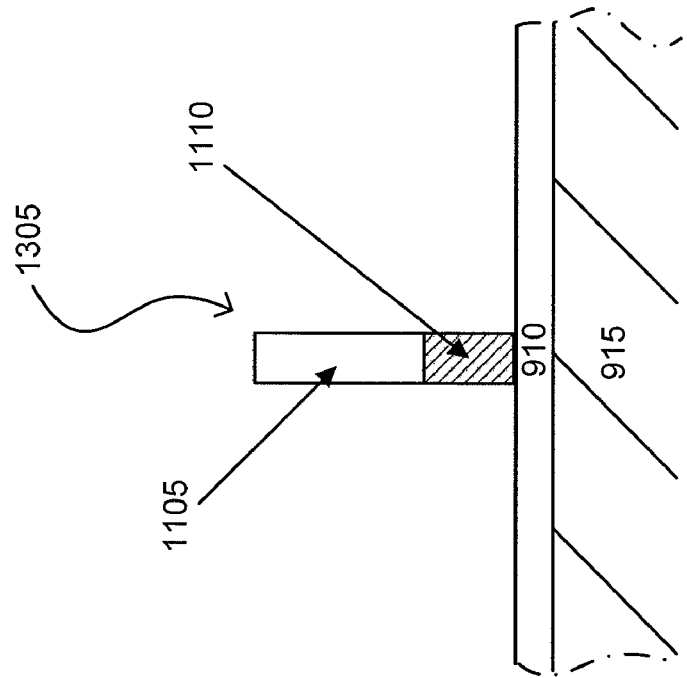
FIG. 13 illustrates the removal of the oxide layer of FIGS. 12A and 12B consistent with another embodiment of the invention.
Figure 15B:
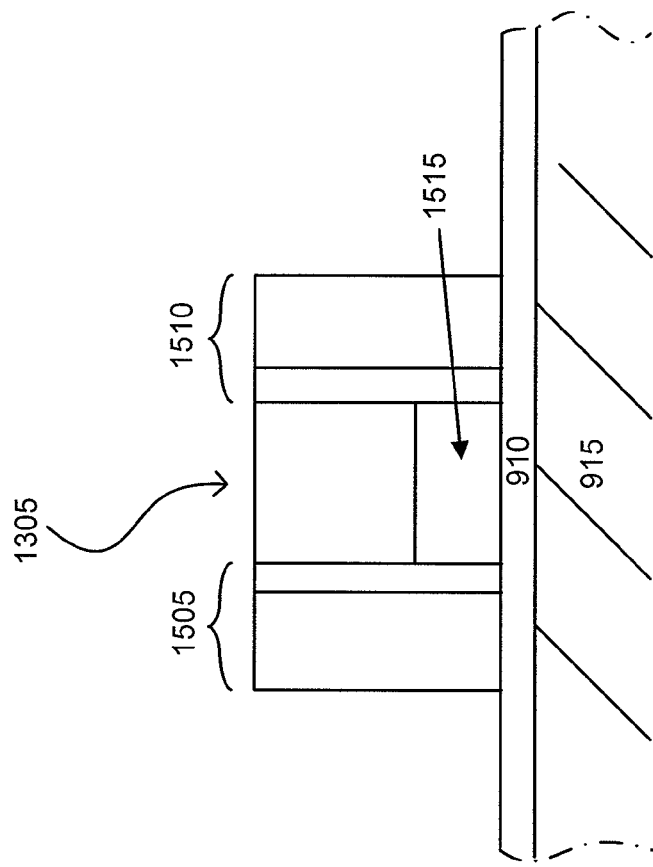
FIGS. 15A and 15B illustrate the removal of the oxide layer and stresser layer of FIG. 14 consistent with another embodiment of the invention.
Figure 15A:
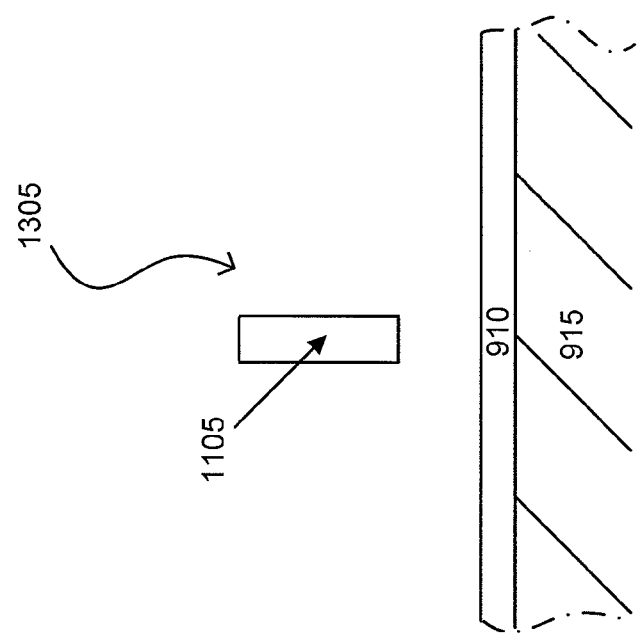

As further shown in FIG. 13, oxide layer 905 may be removed using, for example, a conventional etching process to form a fin 1305. Stresser layer 1110 may then be oxidized, as shown in FIG. 14, with an oxide layer 1405. Stresser layer 1110 may be oxidized, for example, with SiO or $SiO_2$, though other oxide materials may be used. Oxide layer 1405 and stresser layer 1110 may then be removed, as shown in FIGS. 15A and 15B, using, for example, a conventional etching process. After removal of stresser layer 1005, fin 1305 may include strained channel 1105 left remaining between the FinFET source 1505 and drain 1510 regions. The open portion 1515 below strained channel 1105, resulting from etching away oxide layer 1405 and stresser layer 1110, may be used for subsequently forming a U-shaped or round FinFET gate (not shown) to complete the FinFET structure. The exemplary process, as described above with respect to FIGS. 10-15, thus, can be used to produce a U-gate or round gate FinFET that has a strained channel with increased carrier mobility and increased drive current.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional photolithographic, etching and deposition techniques may be employed, and hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A method, comprising:
    forming a first rectangular mesa from a layer of semiconducting material, the first rectangular mesa having four side surfaces;
    forming a first dielectric layer around the first mesa and in direct physical contact with a substantial entirety of each of the four side surfaces of the first mesa;
    forming a first rectangular mask over a first portion of the first mesa leaving an exposed second portion of the first mesa; and
    etching the exposed second portion of the first mesa to produce a reversed T-shaped fin from the first mesa;
    removing the first mask subsequent to etching the exposed second portion of the first mesa;
    removing the first dielectric layer from around the first mesa;
    forming a second dielectric layer over surfaces of the reversed T-shaped fin;
    forming a second rectangular mesa over the second dielectric layer and the reversed T-shaped fin;
    forming a second rectangular mask over a first portion of the second mesa leaving an exposed second portion of the second mesa; and
    etching the exposed second portion of the second mesa to produce a gate that conforms to a shape of the reversed T-shaped fin.

2. The method of claim 1, wherein the first dielectric layer comprises tetraethylorthosilicate (TEOS).

3. The method of claim 1, wherein the layer of semiconducting material has a thickness ranging from about 200 Å to about 1500 Å.

4. The method of claim 1, wherein the first rectangular mesa has a length ranging from about 100 Å to about 1000 Å and a width ranging from about 100 Å to about 1000 Å.

5. The method of claim 1, further comprising:
    polishing the first dielectric layer such that an upper surface of the first dielectric layer is substantially co-planar with an upper surface of the first mesa.

6. The method of claim 1, further comprising:
    forming source and drain regions adjacent different ends of the reversed T-shaped fin.

7. The method of claim 1, wherein etching the exposed second portion of the mesa comprises:

etching the exposed second portion of the first mesa to a depth ranging from about 100 Å to about 1000 Å below an upper surface of the first mesa.

8. A method, comprising:

forming a first rectangular mesa from a layer of semiconducting material, the first mesa having side surfaces;

forming a first dielectric layer around the first mesa, and in direct physical contact with a substantial entirety of the side surfaces of the first mesa, such that an upper surface of the first dielectric layer is substantially co-planar with an upper surface of the first mesa;

forming a rectangular mask over a first portion of the first mesa leaving an exposed second portion of the first mesa;

etching the exposed second portion of the mesa to a depth ranging from about 100 Å to about 1000 Å below an upper surface of the first mesa to produce a reversed T-shaped fin from the first mesa;

forming a second dielectric layer over surfaces of the reversed T-shaped fin;

forming a second rectangular mesa over the reversed T-shaped fin;

forming a second rectangular mask over a first portion of the second mesa leaving an exposed second portion of the second mesa;

etching the exposed second portion of the second mesa to produce a gate that conforms to a shape of the reversed T-shaped fin; and forming source and drain regions adjacent different ends of the reversed T-shaped fin.

\* \* \* \* \*